US011598828B2

(12) United States Patent
Zheng et al.

(10) Patent No.: US 11,598,828 B2
(45) Date of Patent: Mar. 7, 2023

(54) MAGNETIC SENSOR ARRAY WITH DIFFERENT RA TMR FILM

(71) Applicant: Western Digital Technologies, Inc., San Jose, CA (US)

(72) Inventors: Yuankai Zheng, Fremont, CA (US); Christian Kaiser, San Jose, CA (US); Zhitao Diao, Fremont, CA (US); Chih-Ching Hu, Pleasanton, CA (US); Chen-jung Chien, Mountain View, CA (US); Yung-Hung Wang, San Jose, CA (US); Dujiang Wan, San Ramon, CA (US); Ronghui Zhou, Fremont, CA (US); Ming Mao, Dublin, CA (US); Ming Jiang, San Jose, CA (US); Daniele Mauri, San Jose, CA (US)

(73) Assignee: Western Digital Technologies, Inc., San Jose, CA (US)

(*) Notice: Subject to any disclaimer, the term of this patent is extended or adjusted under 35 U.S.C. 154(b) by 348 days.

(21) Appl. No.: 16/730,730

(22) Filed: Dec. 30, 2019

(65) Prior Publication Data

US 2021/0063507 A1    Mar. 4, 2021

Related U.S. Application Data

(60) Provisional application No. 62/891,934, filed on Aug. 26, 2019.

(51) Int. Cl.
*G01R 33/09* (2006.01)
*G01R 17/10* (2006.01)

(52) U.S. Cl.
CPC ......... *G01R 33/098* (2013.01); *G01R 17/105* (2013.01)

(58) Field of Classification Search
CPC .......... G01R 17/10–18; G01R 33/0094; G01R 33/09; G01R 33/098; G01D 5/12; G01D 5/14; G01D 5/16
See application file for complete search history.

(56) References Cited

U.S. PATENT DOCUMENTS

| 4,603,365 A | * | 7/1986 | Nakamura | ........... | G01R 33/025 |
| | | | | | 324/252 |
| 5,621,377 A | * | 4/1997 | Dettmann | ............ | G01R 15/205 |
| | | | | | 324/252 |

(Continued)

FOREIGN PATENT DOCUMENTS

WO    2021040808 A1    3/2021

OTHER PUBLICATIONS

International Search Report and Written Opinion issued in corresponding International Patent Application No. PCT/US2020/024097, dated Jul. 14, 2020 (10 pages).

(Continued)

*Primary Examiner* — Huy Q Phan
*Assistant Examiner* — David B Frederiksen
(74) *Attorney, Agent, or Firm* — Patterson + Sheridan, LLP; Steven H. VerSteeg

(57) ABSTRACT

The present disclosure generally relates to a Wheatstone bridge array that has four resistors. Each resistor includes a plurality of TMR structures. Two resistors have identical TMR structures. The remaining two resistors also have identical TMR structures, though the TMR structures are different from the other two resistors. Additionally, the two resistors that have identical TMR structures have a different resistance area as compared to the remaining two resistors that have identical TMR structures. Therefore, the working bias field for the Wheatstone bridge array is non-zero.

23 Claims, 9 Drawing Sheets

(56) References Cited

U.S. PATENT DOCUMENTS

| | | |
|---|---|---|
| 6,771,472 B1 | 8/2004 | Mao et al. |
| 9,591,221 B2 | 3/2017 | Miller et al. |
| 9,684,184 B2 | 6/2017 | Miller et al. |
| 9,711,200 B2 | 7/2017 | Friedman et al. |
| 2008/0100290 A1* | 5/2008 | Shoji ................ B82Y 25/00 324/252 |
| 2008/0272771 A1* | 11/2008 | Guo ................ G01R 33/093 324/260 |
| 2009/0002898 A1* | 1/2009 | Childress ............ H01L 43/08 360/324.1 |
| 2009/0322319 A1* | 12/2009 | Kreupl ................ H01L 43/10 324/252 |
| 2010/0213933 A1* | 8/2010 | Mather ............ G01R 33/098 324/252 |
| 2011/0025320 A1 | 2/2011 | Ohta et al. |
| 2012/0248556 A1* | 10/2012 | Nikonov ............ H01L 27/22 257/E29.323 |
| 2013/0176022 A1* | 7/2013 | Lee ................ B82Y 25/00 324/252 |
| 2014/0054733 A1 | 2/2014 | Deak et al. |
| 2014/0292319 A1 | 10/2014 | Fang et al. |
| 2015/0309128 A1 | 10/2015 | Raberg |
| 2016/0163962 A1 | 6/2016 | Mather et al. |
| 2016/0238635 A1* | 8/2016 | Zimmer ............ G01R 33/0029 |
| 2016/0320460 A1* | 11/2016 | Mather ................ G01R 33/093 |
| 2019/0020822 A1 | 1/2019 | Sharma et al. |
| 2019/0259520 A1 | 8/2019 | Lassalle-Balier et al. |

OTHER PUBLICATIONS

International Preliminary Report on Patentability for International Application No. PCT/US2020/024097 dated Mar. 10, 2022, 6 pages.

* cited by examiner

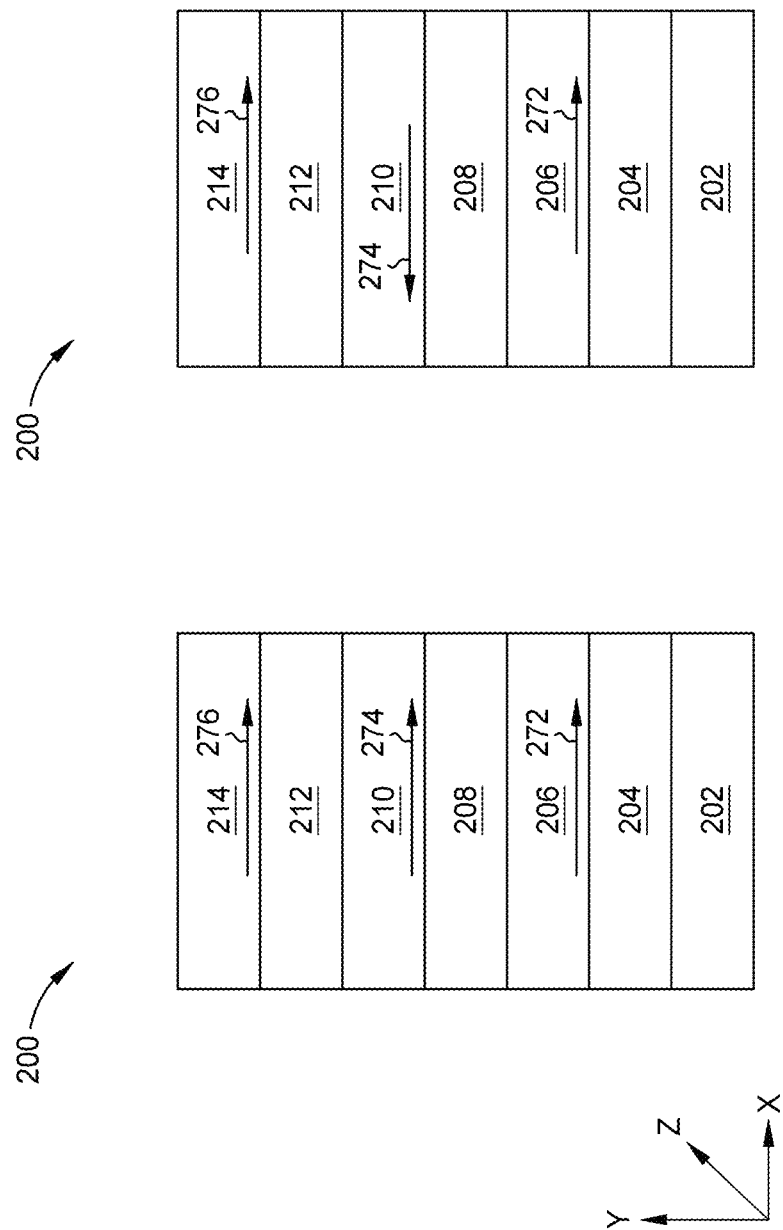

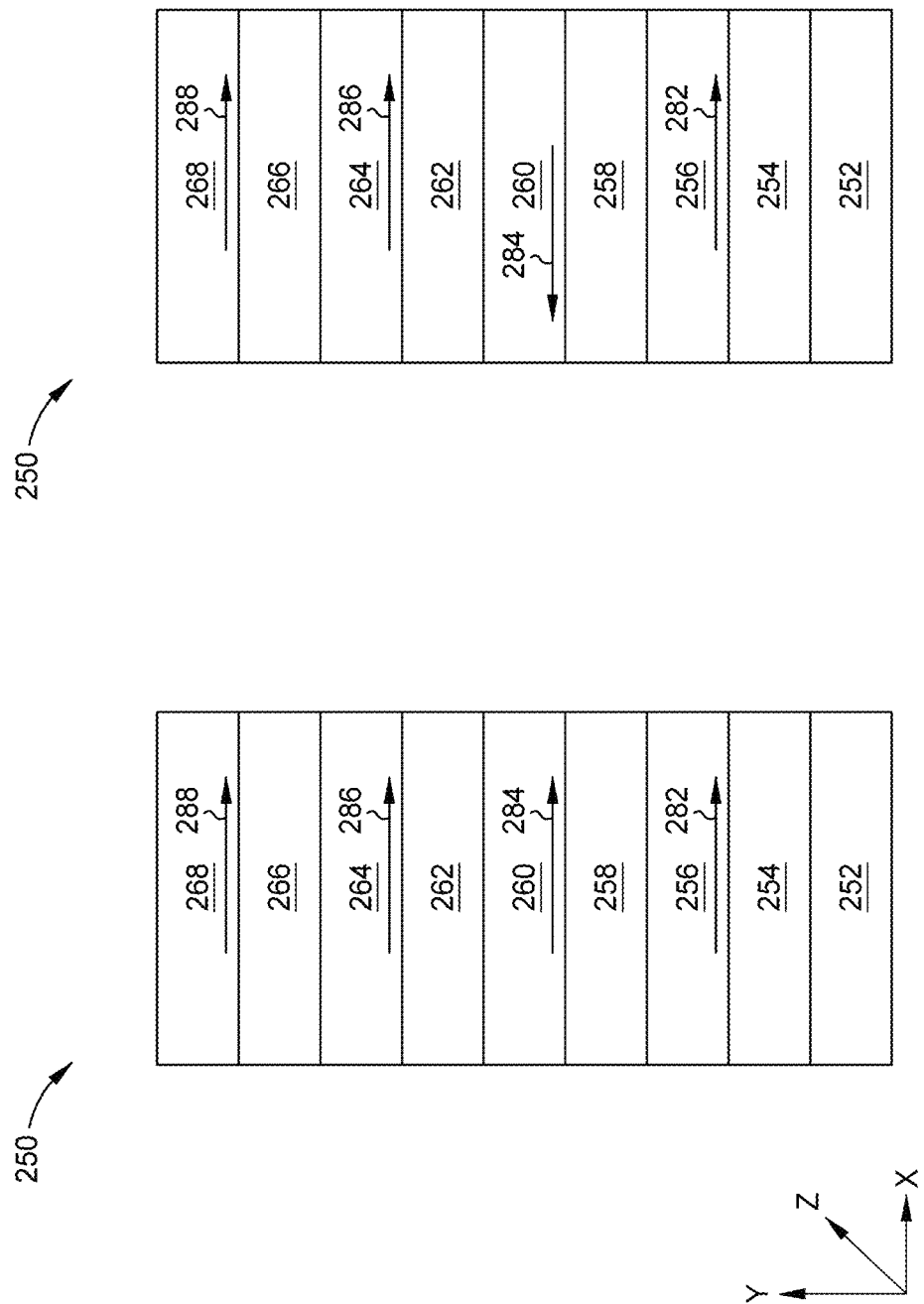

MAGNETIC SENSOR ARRAY WITH DIFFERENT RA TMR FILM

CROSS-REFERENCE TO RELATED APPLICATIONS

This application claims benefit of U.S. Provisional Patent Application Ser. No. 62/891,934, filed Aug. 26, 2019, which is herein incorporated by reference.

BACKGROUND OF THE DISCLOSURE

Field of the Disclosure

Embodiments of the present disclosure generally relate to a Wheatstone bridge array and a method of manufacture thereof.

Description of the Related Art

A Wheatstone bridge is an electrical circuit used to measure an unknown electrical resistance by balancing two legs of a bridge circuit, one leg of which includes an unknown component. The Wheatstone circuit provides extremely accurate measurements in comparison to a simple voltage divider.

The Wheatstone bridge includes multiple resistors that, especially recently, include magnetic material such as a magnetic sensors. Magnetic sensors can include Hall effect magnetic sensors, anisotropy magnetoresistive sensors (AMR), giant magnetoresistive (GMR) sensors, and tunnel magnetoresistive (TMR) sensors. The TMR sensor has a very high sensitivity compared to other magnetic sensors.

The working bias field for the Wheatstone bridge is, generally, zero. A magnet is used to generate the field for the TMR sensors in the Wheatstone bridge. The TMR sensors detect the magnetic field in the X direction. A magnetic position change will impact the magnetic field and hence, the bias field location. While a working bias field of 0 is generally desired for the initial state of the Wheatstone bridge, users may prefer to have a non-zero initial state.

Therefore, there is a need in the art for a Wheatstone bridge array that has a bias field that is non-zero.

SUMMARY OF THE DISCLOSURE

The present disclosure generally relates to a Wheatstone bridge array that has four resistors. Each resistor includes a plurality of TMR structures. Two resistors have identical TMR structures. The remaining two resistors also have identical TMR structures, though the TMR structures are different from the other two resistors. Additionally, the two resistors that have identical TMR structures have a different resistance area as compared to the remaining two resistors that have identical TMR structures. Therefore, the working bias field for the Wheatstone bridge array is non-zero.

In one embodiment, a TMR sensor device comprises: a first resistor comprising a first plurality of tunnel magnetoresistive (TMR) structures that have a first resistance area; and a second resistor comprising a second plurality of TMR structures that have a second resistance area, wherein the first resistance area is greater than the second resistance area.

In another embodiment, a TME sensor device comprises: a plurality of resistors that each contain a plurality of TMR structures, wherein at least two resistors of the plurality of resistors contain a different resistance areas and wherein the TMR structures of the at least two resistors are different.

In another embodiment, a method of manufacturing a TMR sensor device comprises: forming a first resistor comprising a first plurality of TMR structures and a first resistance area; forming a second resistor comprising a second plurality of TMR structures and a second resistance area; forming a third resistor comprising the first plurality of TMR structures and the first resistance area; and forming a fourth resistor comprising the second plurality of TMR structures and the second resistance area, wherein the first plurality of TMR structures is different than the second plurality of TMR structures.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 2A and 2B are schematic illustrations of a TMR structure according to one embodiment.

FIGS. 2C and 2D are schematic illustrations of another TMR structure according to one embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to a Wheatstone bridge array that has four resistors. Each resistor includes a plurality of TMR structures. Two resistors have identical TMR structures. The remaining two resistors also have identical TMR structures, though the TMR structures are different from the other two resistors. Additionally, the two resistors that have identical TMR structures have a different resistance area as compared to the remaining two resistors that have identical TMR structures. Therefore, the working bias field for the Wheatstone bridge array is non-zero.

Figure 1:
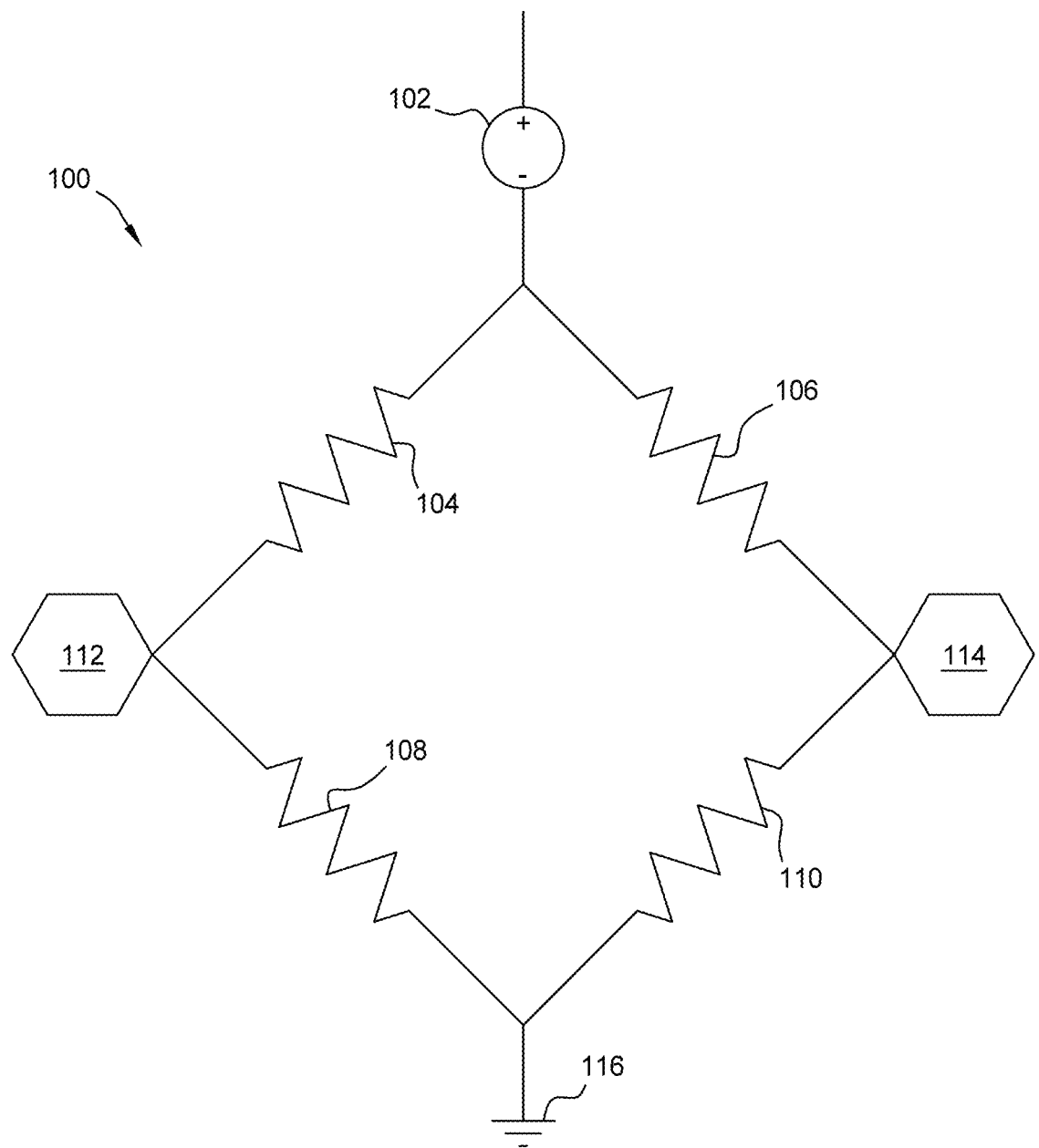
FIG. 1 is a schematic illustration of a Wheatstone bridge array design.

FIG. 1 is a schematic illustration of a Wheatstone bridge array 100 design. The array 100 includes a bias source 102, a first resistor 104, a second resistor 106, a third resistor 108, a fourth resistor 110, a first sensor output pad 112, a second sensor output pad 114, and a ground connection 116. Bias voltage is applied across the array from the bias source 102 to the ground connection 116. The first sensor output pad 112 and the second sensor output pad 114 sense the output of the applied voltage. Any temperature change from the resistors 104, 106, 108, 110 can be cancelled.

As discussed herein, the resistors 104, 106, 108, 110 each include a TMR sensor. In one embodiment, the TMR sensors are each distinct and different such that the resistors 104, 106, 108, 110 have different resistance. In another embodiment, the TMR sensors are identical, but the resistors 104, 106, 108, 110 are different. In still another embodiment, resistors 104, 110 are identical to each other (as are the TMR sensors that comprise the resistors 104, 110), and resistors 106, 108 are identical to each other (as are the TMR sensors that comprise the resistors 106, 108) yet different from resistors 104, 110. For a TMR sensor in array 100, the RA for the array 100 is around 100 Ohms microns$^2$.

Typical magnetic field sensors use MR (magnetoresistance) devices in a Wheatstone bridge circuit. The sensor requires the MR devices to change differently in the bridge. As discussed herein, a new method to make a magnetic field sensor is to fabricate two different TMR films in the same layer. The reliability and performance of the TMR films determines the magnetoresistance response. In this way, combined with different TMR films features, a perfect Wheatstone bridge design for magnetic field sensor can be fabricated.

In regards to FIG. 1, if the free layer of the TMR sensors that comprises the resistors 104, 106, 108, 110 has a long axis of +45° or −45° to the pinned layer magnetization direction, then the free layer easy axis is restricted to be along the long axis due to the shape anisotropy, and the magnetization direction can be set as shown in the cartoon by an ampere field from the set line current, especially if on top of the free layer there is a set line orthogonal to the free layer long axis.

When applying a magnetic field along the Y-axis, resistors 110 and 104 are increasing while resistors 106, 108 are decreasing with the field. This different response enables the Wheatstone bridge, and the sensor sensitivity is proportional to the output voltage which is proportional to the difference between resistor 110 (or resistor 104) and resistor 106 (or resistor 108). However, in use only half of the magnetoresistance change is used due to the 45° free layer or pinned layer initial state. If the free layer to pinned layer initial state can be 90° and still have two different magnetoresistance change, the sensor sensitivity can be increased by a factor of two.

If the free layer and pinned layer are orthogonal, then the pinned layer magnetization direction is set by magnetic annealing direction. Usually resistors 104, 106, 108, 110 are made by the same TMR film and experience the same processes, and therefore all have the same pinned layer direction. Each device can operate in full MR ratio, but all the devices respond to the external field in the same way and consequently there is no output voltage at all. A simple way to resolve this issue is to shield resistor 106 and resistor 108 by covering with a thick NiFe film so that resistor 106 and resistor 108 will not respond to magnetic fields. Alternatively, resistors 106 and 108 can be replaced with constant resistors. However, this kind of half bridge-sensing scheme will also reduce the output voltage and therefore limits the sensitivity.

FIGS. 2A and 2B are schematic illustrations of a TMR structure 200, according to one embodiment. FIG. 2A shows the TMR structure 200 during magnetic annealing, and FIG. 2B shows the TMR structure 200 after magnetic annealing. It is to be understood that the term "TMR sensors" and "TMR structures" are used interchangeably. The TMR sensor 200 includes a seed layer 202 that will be formed on a bottom lead (not shown). In one embodiment, the seed layer 202 comprises a conductive material such as ruthenium and has a thickness of between about 10 Angstroms to about 100 Angstroms and is deposited by well-known deposition methods such as electroplating, electroless plating, or sputtering. Additionally, it is to be understood that while ruthenium has been exemplified as the seed layer 202 material, other materials are contemplated and the embodiments discussed herein are not limited to ruthenium for the seed layer 202.

An antiferromagnetic (AFM) layer 204 is disposed on the seed layer 202. Suitable materials for the AFM layer 204 include IrMn or PtMn at a thickness of between about 40 Angstroms to about 500 Angstroms such as between about 40 Angstroms and about 100 Angstroms. The AFM layer 204 may be formed by well-known deposition methods such as sputtering. Additionally, it is to be understood that while IrMn and PtMn have been exemplified as the AFM layer 204 materials, other materials are contemplated and the embodiments discussed herein are not limited to IrMn or PtMn for the AFM layer 204.

A pinned layer 206 is disposed on the AFM layer 204. Suitable materials for the pinned layer 206 include CoFe, or a Co/CoFe/Co multi-layer stack with a thickness of between about 20 Angstroms and about 30 Angstroms. The pinned layer 206 may be formed by well-known deposition methods such as sputtering. Additionally, it is to be understood that while CoFe or Co/CoFe/Co have been exemplified as the pinned layer 206 material, other materials are contemplated and the embodiments discussed herein are not limited to CoFe or Co/CoFe/Co for the pinned layer 206.

A spacer layer 208 is disposed on the pinned layer 206. Suitable materials for the spacer layer 208 includes Ru at a thickness of between about 4 Angstroms to about 10 Angstroms. The spacer layer 208 may be formed by well-known deposition methods such as sputtering. Additionally, it is to be understood that while ruthenium has been exemplified as the spacer layer 208 material, other materials are contemplated and the embodiments discussed herein are not limited to ruthenium for the spacer layer 208.

A reference layer 210 is disposed on the spacer layer 208. Suitable materials for the reference layer 210 include CoFe/Ta/CoFeB/CoFe as a multilayer stack. The first CoFe layer may have a thickness of between about 8 Angstroms to about 10 Angstroms. The Ta layer may have a thickness of between about 0.5 Angstroms to about 2 Angstroms. The CoFeB layer may have a thickness of between about 10 Angstroms to about 15 Angstroms. The second CoFe layer may have a thickness of between about 3 Angstroms to about 10 Angstroms. The reference layer 210 may be formed by well-known deposition methods such as sputtering. Additionally, it is to be understood that while CoFe/Ta/CoFeB/CoFe has been exemplified as the reference layer 210 material, other materials are contemplated and the embodiments discussed herein are not limited to CoFe/Ta/CoFeB/CoFe for the reference layer 210.

A barrier layer 212 is disposed on the reference layer 210. Suitable materials for the barrier layer 212 include MgO at a thickness of between about 10 Angstroms to about 20 Angstroms. It is to be understood that while MgO is exemplified as the barrier layer 212, other insulating materials as contemplated.

A free layer 214 is disposed on the barrier layer 212. Suitable materials for the free layer 214 include a CoFe/CoFeB/Ta/NiFe multilayer stack. The CoFe layer may have a thickness of between about 3 Angstroms to about 10 Angstroms. The CoFeB layer may have a thickness of between about 10 Angstroms to about 20 Angstroms. The Ta layer may have a thickness of between about 0.5 Angstroms to about 2 Angstroms. The NiFe layer may have a thickness of between about 3 Angstroms to about 300 Angstroms, such as between about 3 Angstroms and about 10 Angstroms or between about 10 Angstroms and about 300 Angstroms. The free layer 214 may be formed by well-known deposition methods such as sputtering. Additionally, it is to be understood that while CoFe/CoFeB/Ta/NiFe has been exemplified as the free layer 214 material, other materials are contemplated and the embodiments discussed herein are not limited to CoFe/CoFeB/Ta/NiFe for the free layer 214.

Capping layers may be formed over the free layer 214. The TMR sensor 200 is annealed in a magnetic oven at a temperature of between about 250 degrees Celsius to about 300 degrees Celsius under a magnetic field of between about 10,000 Oe to about 50,000 Oe. The pinned layer 206 is pinned by the AFM layer 204 as shown by arrow 272, and the magnetic moment will not change when an external field is applied. The reference layer 210 is antiferromagnetically coupled with the pinned layer 206 through the thin spacer layer 208 as shown by arrow 274. The reference layer 210 is also fixed. The free layer 214 can be slightly biased to get the linear signal. The free layer 214 can rotate when an external field is applied as shown by arrow 276. As shown in FIGS. 2A and 2B, the reference layer 210 has flipped due to the magnetic annealing.

FIGS. 2C and 2D are schematic illustrations of a TMR structure 250 according to one embodiment. FIG. 2C illustrates the TMR structure 250 during magnetic annealing, and FIG. 2D illustrates the TMR structure 250 after magnetic annealing. It is to be understood that the term "TMR sensors" and "TMR structures" are used interchangeably. The TMR sensor 250 includes a seed layer 252 that will be formed on a bottom lead (not shown). In one embodiment, the seed layer 252 comprises a conductive material such as ruthenium and has a thickness of between about 10 Angstroms to about 100 Angstroms and is deposited by well-known deposition methods such as electroplating, electroless plating, or sputtering. Additionally, it is to be understood that while ruthenium has been exemplified as the seed layer 252 material, other materials are contemplated and the embodiments discussed herein are not limited to ruthenium for the seed layer 252.

An AFM layer 254 is disposed on the seed layer 252. Suitable materials for the AFM layer 254 include IrMn or PtMn at a thickness of between about 40 Angstroms to about 500 Angstroms such as between about 40 Angstroms and about 100 Angstroms. The AFM layer 254 may be formed by well-known deposition methods such as sputtering. Additionally, it is to be understood that while IrMn and PtMn have been exemplified as the AFM layer 254 materials, other materials are contemplated and the embodiments discussed herein are not limited to IrMn or PtMn for the AFM layer 404.

A first pinned layer 256 is disposed on the AFM layer 254. Suitable materials for the first pinned layer 256 include CoFe, or a Co/CoFe/Co multi-layer stack with a thickness of between about 20 Angstroms and about 30 Angstroms. The first pinned layer 256 may be formed by well-known deposition methods such as sputtering. Additionally, it is to be understood that while CoFe or Co/CoFe/Co have been exemplified as the first pinned layer 256 material, other materials are contemplated and the embodiments discussed herein are not limited to CoFe or Co/CoFe/Co for the first pinned layer 256.

A first spacer layer 258 is disposed on the first pinned layer 256. Suitable materials for the first spacer layer 258 includes Ru at a thickness of between about 4 Angstroms to about 10 Angstroms. The first spacer layer 258 may be formed by well-known deposition methods such as sputtering. Additionally, it is to be understood that while ruthenium has been exemplified as the first spacer layer 258 material, other materials are contemplated and the embodiments discussed herein are not limited to ruthenium for the first spacer layer 258.

A second pinned layer 260 is disposed on the first spacer layer 258. Suitable materials for the second pinned layer 260 include CoFe, or a Co/CoFe/Co multi-layer stack with a thickness of between about 20 Angstroms and about 45 Angstroms. The second pinned layer 260 may be formed by well-known deposition methods such as sputtering. Additionally, it is to be understood that while CoFe or Co/CoFe/Co have been exemplified as the second pinned layer 260 material, other materials are contemplated and the embodiments discussed herein are not limited to CoFe or Co/CoFe/Co for the second pinned layer 260. The second pinned layer 260 is thicker than the first pinned layer 256.

A second spacer layer 262 is disposed on the second pinned layer 260. Suitable materials for the second spacer layer 262 includes Ru at a thickness of between about 4 Angstroms to about 10 Angstroms. The second spacer layer 262 may be formed by well-known deposition methods such as sputtering. Additionally, it is to be understood that while ruthenium has been exemplified as the second spacer layer 262 material, other materials are contemplated and the embodiments discussed herein are not limited to ruthenium for the second spacer layer 262.

A reference layer 264 is disposed on the second spacer layer 262. Suitable materials for the reference layer 264 include CoFe/Ta/CoFeB/CoFe as a multilayer stack. The first CoFe layer may have a thickness of between about 8 Angstroms to about 10 Angstroms. The Ta layer may have a thickness of between about 0.5 Angstroms to about 2 Angstroms. The CoFeB layer may have a thickness of between about 10 Angstroms to about 15 Angstroms. The second CoFe layer may have a thickness of between about 3 Angstroms to about 10 Angstroms. The reference layer 264 may be formed by well-known deposition methods such as sputtering. Additionally, it is to be understood that while CoFe/Ta/CoFeB/CoFe has been exemplified as the reference layer 264 material, other materials are contemplated and the embodiments discussed herein are not limited to CoFe/Ta/CoFeB/CoFe for the reference layer 264.

A barrier layer 266 is disposed on the reference layer 264. Suitable materials for the barrier layer 266 include MgO at a thickness of between about 10 Angstroms to about 20 Angstroms. It is to be understood that while MgO is exemplified as the barrier layer 266, other insulating materials as contemplated.

A free layer 268 is disposed on the barrier layer 266. Suitable materials for the free layer 268 include a CoFe/CoFeB/Ta/NiFe multilayer stack. The CoFe layer may have a thickness of between about 3 Angstroms to about 10 Angstroms. The CoFeB layer may have a thickness of between about 10 Angstroms to about 20 Angstroms. The Ta layer may have a thickness of between about 0.5 Angstroms to about 2 Angstroms. The NiFe layer may have a thickness of between about 3 Angstroms to about 300 Angstroms, such as between about 3 Angstroms and about 10 Angstroms or between about 10 Angstroms and about 300 Angstroms. The free layer 268 may be formed by well-known deposition methods such as sputtering. Additionally, it is to be understood that while CoFe/CoFeB/Ta/NiFe has been exemplified as the free layer 268 material, other materials are contemplated and the embodiments discussed herein are not limited to CoFe/CoFeB/Ta/NiFe for the free layer 268.

For the Wheatstone bridge array, all of the resistors cannot be identical. Rather, for example, resistors 104, 110 are identical to each other and resistors 106, 108 are identical to each other and different than resistors 104, 110. TMR sensor 250 will represent the resistors 106, 108 in certain embodiments.

Capping layers may be formed over the free layer 268. The TMR sensor 250 is annealed in a magnetic oven at a temperature of between about 250 degrees Celsius to about 300 degrees Celsius under a magnetic field of between about 10,000 Oe to about 50,000 Oe. During magnetic annealing, the magnetic moment for the first pinned layer 256, the second pinned layer 260, and reference layer 264 are all set to the same direction as shown by arrows 282, 284, 286 in FIG. 2C. After the magnetic annealing, the reference layer 210 will antiparallel the first pinned layer 256 due to the synthetic antiferromagnetic structure. However, the reference layer 264 will be parallel to the first pinned layer 256 and antiparallel to the second pinned layer 260. Therefore, the reference layers 210, 264 will have the magnetic moment in the opposite direction. The free layer 268 can be slightly biased to get the linear signal. The free layer 268 can rotate when an external field is applied as shown by arrow 288.

Figure 3B:
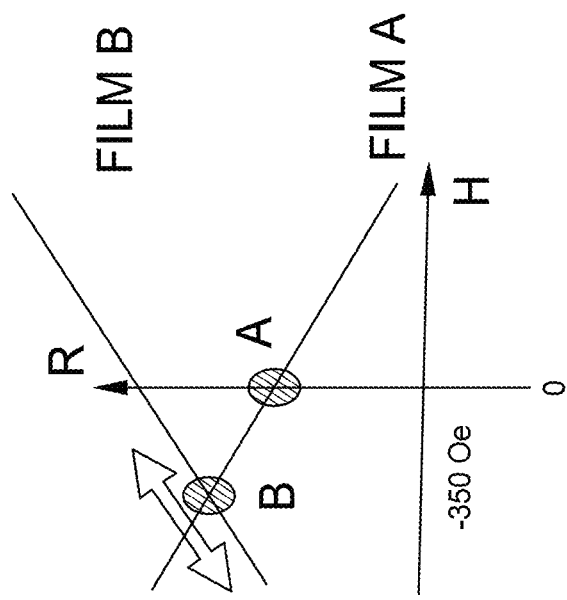
FIGS. 3A and 3B are graphs illustrating the working bias field for two different Wheatstone bridge arrays.
Figure 3A:
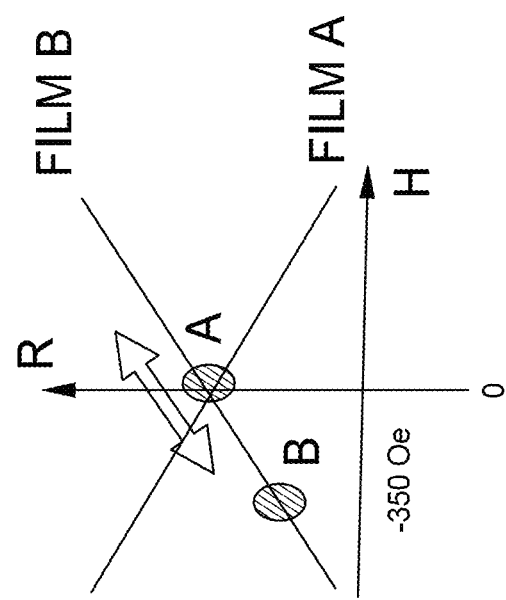

FIGS. 3A and 3B are graphs illustrating the working bias field for two different Wheatstone bridge arrays. Film A may refer to the TMR structure 200 while Film B may refer to TMR structure 250. Point A in FIG. 3A is the location where the lines for Film A and Film B cross. In FIG. 3A, Point A is at the location where the bias field is 0. As discussed above, oftentimes, users desire the location where the lines for Film A and Film B cross to be a non-zero location. Therefore, a shift to the line for either Film A or Film B or both can be used to accommodate the user's desire for a non-zero location. As shown in FIG. 3B, Point B is the location where the lines for Film A and Film B cross, which is at a non-zero location. The non-zero location is shown to be −350 Oe, but it is to be understood that the location need not be −350 Oe, but rather, can be selected by the user. The Wheatstone bridge array can then be designed as discussed below to meet the user demands.

Figure 4:
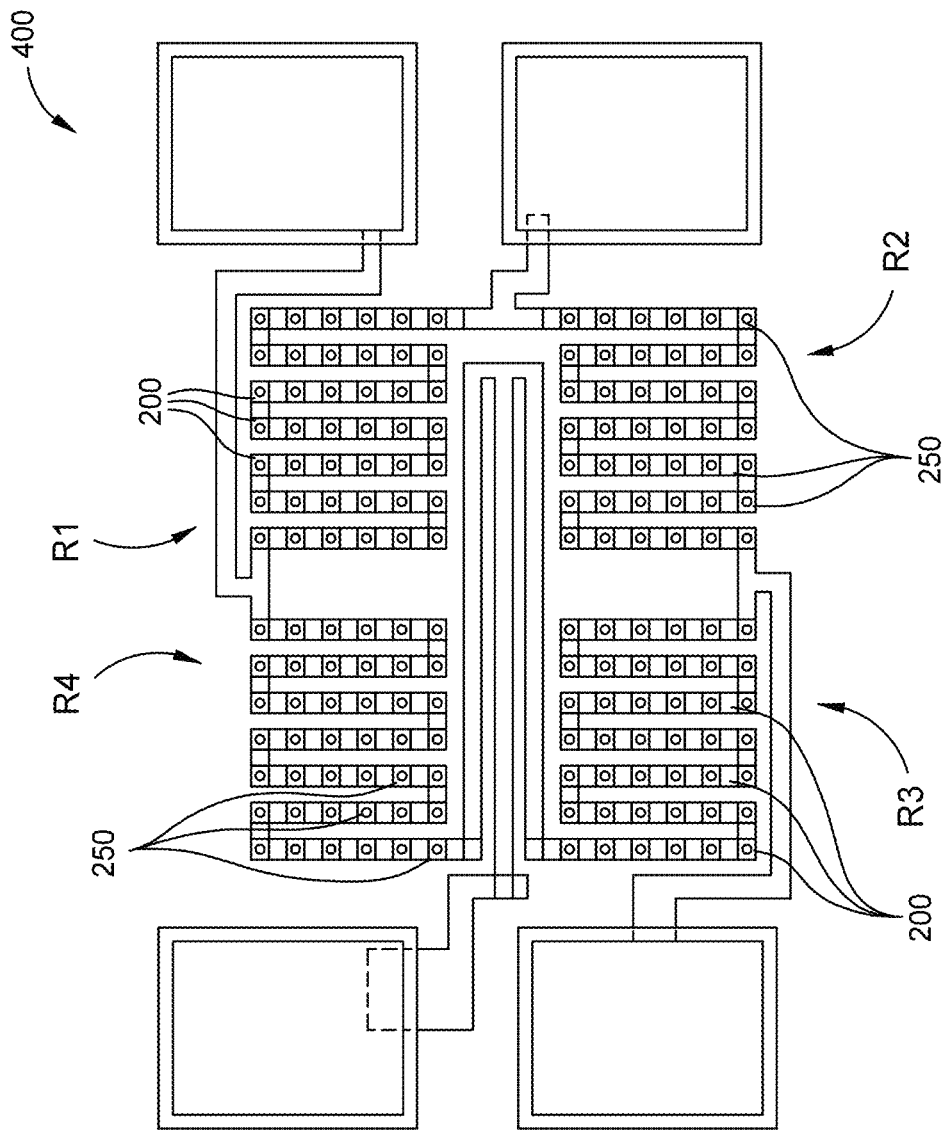
FIG. 4 is a schematic illustration of a Wheatstone bridge array with multiple TMR structures for each resistor.

FIG. 4 is a schematic illustration of a Wheatstone bridge array 400 with multiple TMR structures for each resistor R1, R2, R3, R4. R1 may correspond to resistor 104; R2 may correspond to resistor 106; R3 may correspond to resistor 110; and R4 may correspond to resistor 108. When the working field bias is set to 0, then R1=R2=R3=R4. Additionally, the resistors R1 and R3 are distinct from resistors R2 and R4 based upon the TMR structures to provide two different magnetoresistances responses.

In the array 400, each resistor R1, R2, R3, R4 includes a plurality of TMR structures 200, 250. More specifically, in one embodiment, resistors R1 and R3 will include a plurality of TMR structures 200 and resistors R2 and R4 will include a plurality of TMR structures 250. In another embodiment, resistors R1 and R3 will include a plurality of TMR structures 250 and resistors R2 and R4 will include a plurality of TMR structures 200. For simplicity, FIG. 4 illustrates resistors R1 and R3 having TMR structures 200 while resistors R2 and R4 have TMR structures 250. The TMR structures 200, 250 in resistors R1 and R3 are identical in both number and design. Similarly, the TMR structures 200, 250 in resistors R2 and R4 are identical in both number and design.

The typical magnetic field sensor uses MR devices in a Wheatstone bridge circuit. A key is to make the MR change differently in the bridge. Herein, the magnetic field sensor has an adjustable bias point. Two different sets of TMR structures 200, 250 have with two different magnetoresistance responses. Both TMR structures 200, 250 have free layer and pinned layer magnetic moments that are orthogonal to each other, but the magnetoresistance responses are reversed (i.e., one TMR structure has resistance increasing while the other has resistance decreasing linearly with the external magnetic field). Additionally, the bias point can be adjusted to operate within a given external magnetic field range.

When the user desires a Wheatstone bridge array that has a non-zero working field bias, an adjustment to the resistors needs to be made. In the embodiments discussed herein, the number of TMR structures 200, 250 is identical for all of the resistors R1-R4. The resistance area for the resistors R1-R4 is, however, different. More specifically, the TMR structures 200, 250 have the same length and width, but the TMR structures 200, 250 have different barrier thicknesses. In regards to TMR structure 200, the total barrier thickness is between about 10 Angstroms and about 20 Angstroms. TMR structure 250, on the other hand, will have a total barrier thickness of between about 10.5 Angstroms and about 20.5 Angstroms. In total, the barrier thickness of TMR structures 250 is greater than the barrier thickness of TMR structure 200. Thus, due to the difference in barrier thickness, the resistance area (RA) of the TMR structures 200, 250 is different. More specifically, the RA for TMR structure 250 is less than the RA for TMR structure 200. Even more specifically, the different thickness of the barrier layers 212, 266 for the TMR structures 200, 250 results in a different RA.

The different RA causes the non-zero working field bias to happen. The RA for resistors R1 and R3 will be identical, while the resistors R2 and R4 have a RA that is identical to each other, but different than the RA of resistors R1 and R3. The different RA of TMR structures 200, 250 leads to a non-zero working field bias. If the resistors R1-R4 all have the same RA and the same number of TMR structures 200, 250, then the working field bias would be zero. By making the RA different for the resistors R1 and R3 relative to resistors R2 and R4, the working field bias is non-zero. Additionally, while the RA for the TMR structures 200, 250 is different, the number of TMR structures 200, 250 is identical even though different resistors R1-R4 have different TMR structures 200, 250.

For the embodiment shown in FIG. 4, the RA of TMR structures 200 is different than the RA of TMR structures 250. The magnetoresistances of the TMR structures 200, 250 are different. For the resistors R1-R4, there are a plurality of TMR structures 200, 250 coupled together in an array.

In one embodiment, resistors R1 and R3 have a plurality of TMR structures 200 that are arranged in an array; resistors R2 and R4 have a plurality of TMR structures 250 that are arranged in an array; and the RA of TMR structures 200 for resistors R1 and R3 is greater than the RA of TMR structures 250 for resistors R2 and R4. In another embodiment, resistors R1 and R3 have a plurality of TMR structures 250 that are arranged in an array; resistors R2 and R4 have a plurality of TMR structures 200 that are arranged in an array; and the RA of TMR structures 250 for resistors R1 and R3 is less than the RA of TMR structures 200 for resistors R2 and R4. In any embodiment, the number of TMR structures 200, 250 for resistors R1-R4 is identical.

Figure 5B:
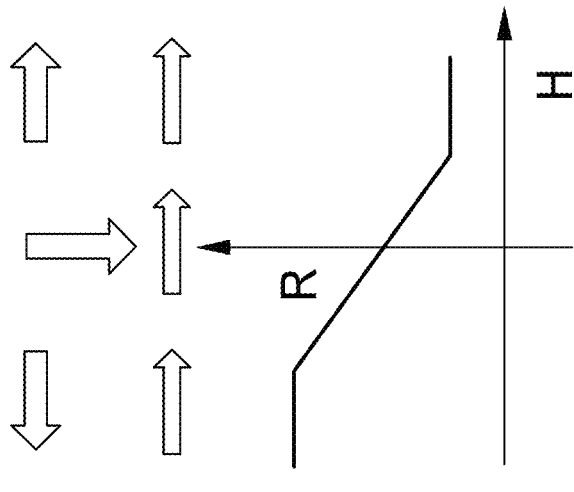
FIGS. 5A and 5B are graphs illustrating the R-H curve of TMR structures.
Figure 5A:
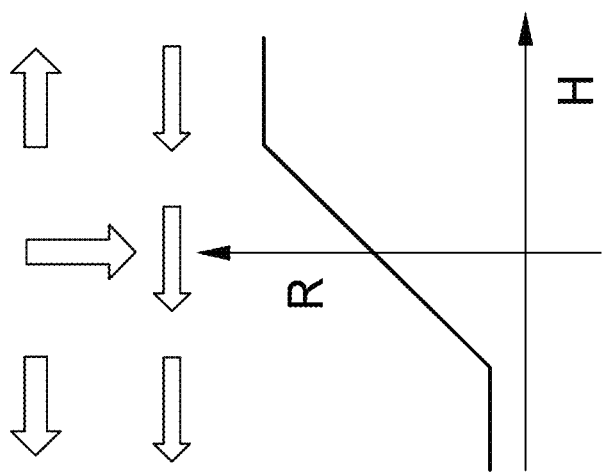

FIGS. 5A and 5B are graphs illustrating the R-H curve of TMR structures 200, 250. FIG. 5A shows TMR structure 200 while FIG. 5B shows TMR structure 250. TMR structure 200 has a greater RA than TMR structure 250. The output voltage is zero because both TMR structure 200, 250 have different RA. Also, because the reference layers 210, 264 have opposite magnetic direction in the two TMR structure 200, 250, the two sensors will sense the external field in a different way with one having a positive slope and the other having a negative slope.

Figure 6A:
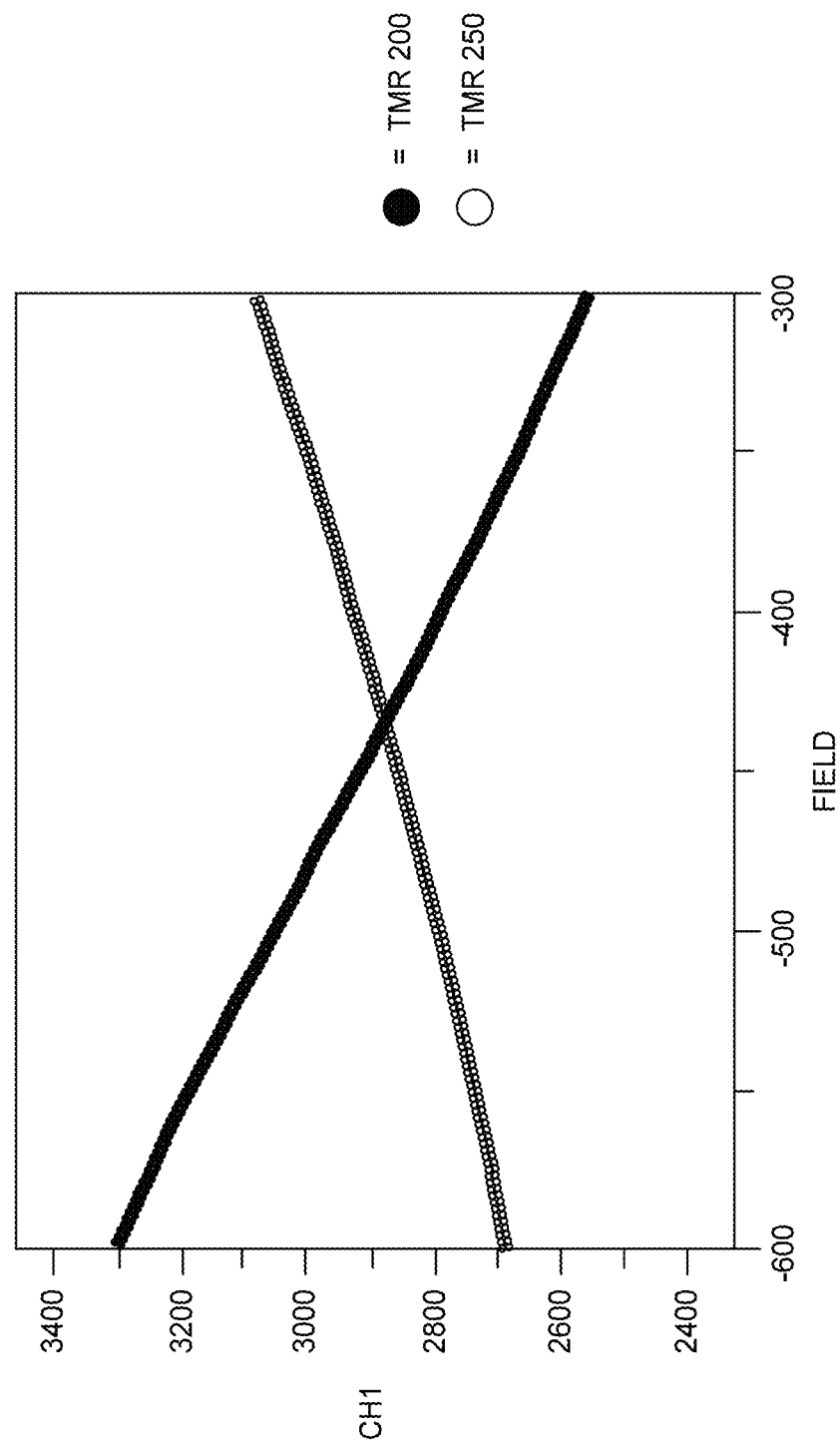
FIGS. 6A and 6B are graphs illustrating the R-H curves for TMR structures.
Figure 6B:
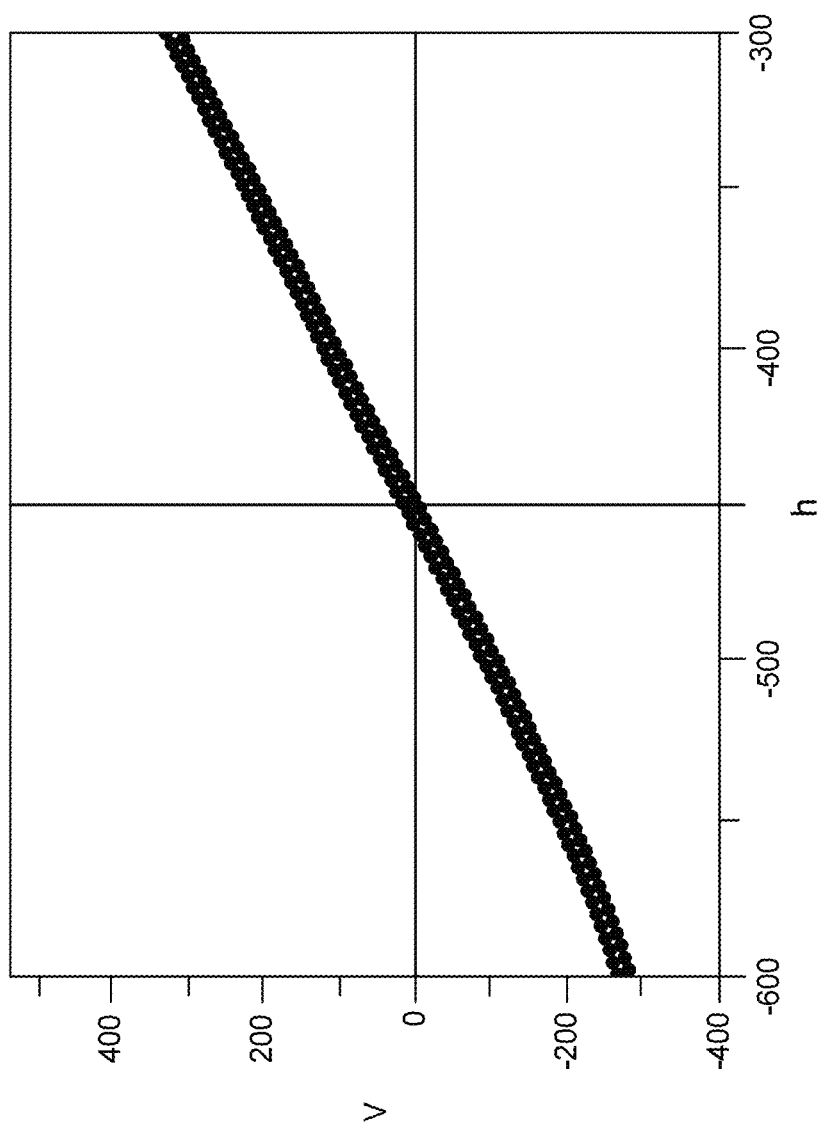

FIGS. 6A and 6B are graphs illustrating the R-H curves for TMR structures 200, 250. In FIG. 6A, TMR structure 200 has a higher RA as compared to TMR structure 250. In FIG. 6B, the output with zero at 450 Oe is shown.

Figure 7:
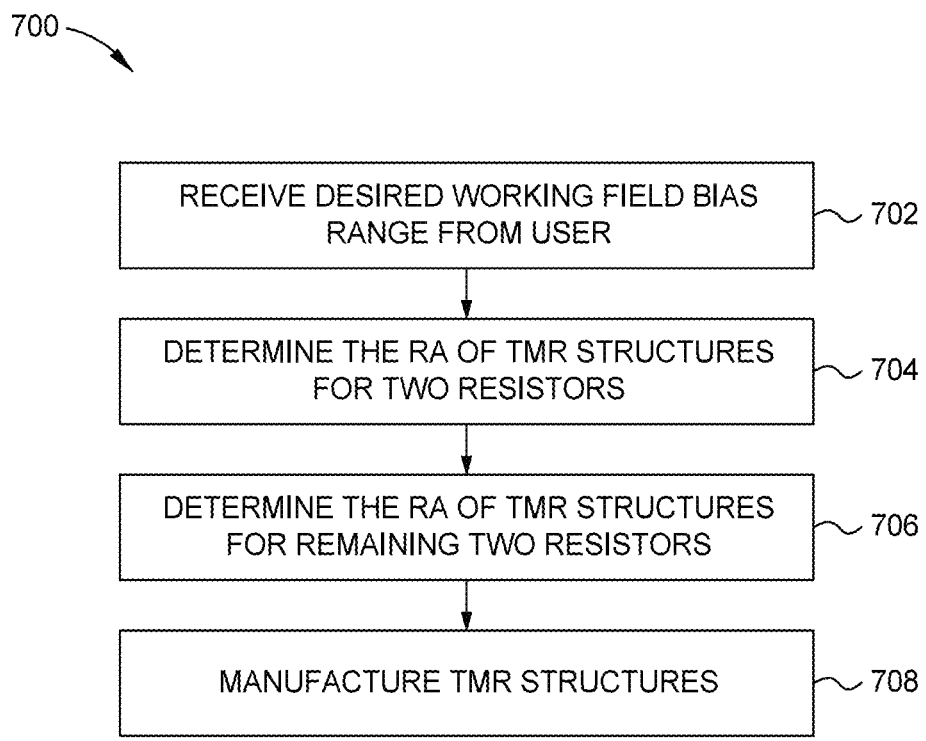
FIG. 7 is a flowchart illustrating a method of manufacturing a Wheatstone bridge array.

FIG. 7 is a flowchart illustrating a method 700 of manufacturing a Wheatstone bridge array. The method operates by initially receiving a range for the working bias field from the user in step 702. Then, the RA of TMR structures is set for two resistors in step 704. Thereafter, based upon the RA of TMR structures for two resistors, the RA of TMR structures necessary to achieve the middle point working field bias for the working field bias range selected by the user is determined in step 706. Finally, the TMR structures for each resistor is manufactured simultaneously in step 708.

In one embodiment, a TMR sensor device comprises: a first resistor comprising a first plurality of tunnel magnetoresistive (TMR) structures that have a first resistance area; and a second resistor comprising a second plurality of TMR structures that have a second resistance area, wherein the first resistance area is greater than the second resistance area. The TMR structures of the first plurality of TMR structures are identical to each other. The TMR structures of the second plurality of TMR structures are identical to each other. The TMR structures of the first plurality of TMR structures are different from the TMR structures of the second plurality of TMR structures. The TMR sensor arrangement further comprises: a third resistor comprising a third plurality of TMR structures having a third resistance area; and a fourth resistor comprising a fourth plurality of TMR structures having a fourth resistance area. The third resistance area is greater than the fourth resistance area. The third resistance area is equal to the first resistance area. The fourth resistance area is equal to the second resistance area. The TMR structures of the third plurality of TMR structures are identical to each other. The TMR structures of the fourth plurality of TMR structures are identical to each other. The TMR structures of the third plurality of TMR structures are identical to the TMR structures of the first plurality of TMR structures. The TMR structures of the fourth plurality of TMR structures are identical to the TMR structures of the second plurality of TMR structures.

In another embodiment, a TMR sensor device comprises: a plurality of resistors that each contain a plurality of TMR structures, wherein at least two resistors of the plurality of resistors contain a different resistance areas and wherein the TMR structures of the at least two resistors are different. The plurality of resistors have an identical number of TMR structures. The array has a bias point that is less than 0 Oe. At least one TMR structure contains a synthetic antiferromagnetic structure. There are more TMR structures that contain the synthetic antiferromagnetic structure than TMR structures that do not contain the synthetic antiferromagnetic structure.

In another embodiment, a method of manufacturing a TMR sensor device comprises: forming a first resistor comprising a first plurality of TMR structures and a first resistance area; forming a second resistor comprising a second plurality of TMR structures and a second resistance area; forming a third resistor comprising the first plurality of TMR structures and the first resistance area; and forming a fourth resistor comprising the second plurality of TMR structures and the second resistance area, wherein the first plurality of TMR structures is different than the second plurality of TMR structures. The third resistor and the first resistor are substantially identical. The first resistance area is more than two times the second resistance area.

In one embodiment, the TMR sensor is used in a camera operating as a single axis sensor. An example of such a sensor is found in United States Patent Application Publication No.: 2019/0020822 A1, which is incorporated herein by reference. However, it is contemplated that the TMR sensor may be utilized as a two dimensional or even a three dimensional sensor. Additionally, it is contemplated that TMR sensor may be integrated and utilized in inertial measurement unit technologies other than cameras such as wearable devices, compasses, and MEMS devices. Furthermore, the TMR sensor may operate as a position sensor, a bridge angular sensor, a magnetic switch, a current sensor, or combinations thereof. The TMR sensor may be used to focus a camera such as a smart phone camera by using the TMR sensors as position and angular sensors. Also, TMR sensors have applicability in the automotive industry as switch, current, and angular sensors to replace current Hall, anisotropic magnetoresistance (AMR) and giant magnetoresistance (GMR) sensors. TMR sensors may also be used in the drones and robotics industry as position and angular sensors. Medical devices can also utilize TMR sensors for flow rate control for infusion systems and endoscope camera sensors among others. Thus, the TMR sensors discussed herein have applications well beyond smart phone cameras and thus should not be limited to use as sensors for smart phone cameras. Furthermore, TMR sensors need not be arranged in a Wheatstone bridge arrangement, but rather, may be arranged in any number of manners.

By altering the resistance area TMR structures within a particular set of resistors in a Wheatstone bridge array while keeping the number of TMR structures constant for all resistors, the working bias field point can be tailored to meet the needs of the user.

While the foregoing is directed to embodiments of the present disclosure, other and further embodiments of the disclosure may be devised without departing from the basic scope thereof, and the scope thereof is determined by the claims that follow.

What is claimed is:

1. A tunnel magnetoresistive (TMR) sensor device, comprising:
   a first resistor comprising a first plurality of TMR structures that have a first resistance area, at least one of the first plurality of TMR structures comprising:
   a first pinned layer,
   a first free layer, and
   a first barrier layer between the first pinned layer and the first free layer, the first barrier layer having a first thickness within a range of 10 Angstroms to 20 Angstroms; and
   a second resistor comprising a second plurality of TMR structures that have a second resistance area, at least one of the second plurality of TMR structures comprising:
   a second pinned layer,
   a second free layer, and
   a second barrier layer between the second pinned layer and the second free layer, the second barrier layer having a second thickness within a range of 10.5 Angstroms to 20.5 Angstroms, wherein the second thickness is greater than the first thickness, and the first resistance area is greater than the second resistance area.

2. The TMR sensor device of claim 1, wherein the TMR structures of the first plurality of TMR structures are identical to each other.

3. The TMR sensor device of claim 2, wherein the TMR structures of the second plurality of TMR structures are identical to each other.

4. The TMR sensor device of claim 3, wherein the TMR structures of the first plurality of TMR structures are different from the TMR structures of the second plurality of TMR structures.

5. The TMR sensor device of claim 1, further comprising:
   a third resistor comprising a third plurality of TMR structures having a third resistance area; and
   a fourth resistor comprising a fourth plurality of TMR structures having a fourth resistance area.

6. The TMR sensor device of claim 5, wherein the third resistance area is greater than the fourth resistance area.

7. The TMR sensor device of claim 6, wherein the third resistance area is equal to the first resistance area.

8. The TMR sensor device of claim 7, wherein:
   the fourth resistance area is equal to the second resistance area;
   the first resistor and the second resistor are each coupled to a bias source;
   the third resistor and the fourth resistor are each coupled to a ground connection;
   the first resistor and the fourth resistor are each coupled to a first sensor output pad; and
   the second resistor and the third resistor are each coupled to a second sensor output pad.

9. The TMR sensor device of claim 8, wherein the TMR structures of the third plurality of TMR structures are identical to each other.

10. The TMR sensor device of claim 9, wherein the TMR structures of the fourth plurality of TMR structures are identical to each other.

11. The TMR sensor device of claim 10, wherein the TMR structures of the third plurality of TMR structures are identical to the TMR structures of the first plurality of TMR structures.

12. The TMR sensor device of claim 11, wherein the TMR structures of the fourth plurality of TMR structures are identical to the TMR structures of the second plurality of TMR structures.

13. The TMR sensor device of claim 7, wherein the first plurality of TMR structures is different than the second plurality of TMR structures.

14. The TMR sensor device of claim 7, wherein the third resistor and the first resistor are substantially identical.

15. The TMR sensor device of claim 1, wherein the first resistance area is more than two times the second resistance area.

16. A tunnel magnetoresistive (TMR) sensor device, comprising:
   a first resistor comprising:
   a first pinned layer,
   a first free layer, and
   a first barrier layer between the first pinned layer and the first free layer, the first barrier layer having a first thickness within a range of 10 Angstroms to 20 Angstroms; and
   a second resistor comprising:
   a second pinned layer,
   a second free layer, and
   a second barrier layer between the second pinned layer and the second free layer, the second barrier layer having a second thickness within a range of 10.5 Angstroms to 20.5 Angstroms, wherein the second thickness is different from the first thickness such that the first resistor and the second resistor contain different resistance areas.

17. The TMR sensor device of claim 16, wherein the first resistor and the second resistor have an identical number of TMR structures.

18. The TMR sensor device of claim 16, wherein the TMR sensor device has a bias point that is less than 0 Oe.

19. The TMR sensor device of claim 16, wherein the TMR sensor device comprises one or more TMR structures, and at least one TMR structure of the one or more TMR structures contains a synthetic antiferromagnetic structure.

20. The TMR sensor device of claim 19, wherein there are more TMR structures of the one or more TMR structures that contain the synthetic antiferromagnetic structure than at least one TMR structure of the one or more TMR structures that does not contain the synthetic antiferromagnetic structure.

21. A tunnel magnetoresistive (TMR) sensor device, comprising:
   a first resistor comprising a first plurality of TMR structures that each have a first resistance area, each of the first plurality of TMR structures comprising:
   a first pinned layer,
   a first free layer, and
   a first barrier layer between the first pinned layer and the first free layer, the first barrier layer having a first thickness within a range of 10 Angstroms to 20 Angstroms; and
   a second resistor comprising a second plurality of TMR structures that each have a second resistance area, each of the second plurality of TMR structures comprising:
   a second pinned layer,
   a second free layer, and
   a second barrier layer between the second pinned layer and the second free layer, the second barrier layer having a second thickness within a range of 10.5 Angstroms to 20.5 Angstroms, wherein the second thickness is greater than the first thickness, and the first resistance area is greater than the second resistance area.

22. The TMR sensor device of claim 21, wherein:

the first resistor further comprises a first reference layer between the first pinned layer and the first barrier layer, the first reference layer having a first magnetic direction; and the second resistor further comprises a second reference layer between the second pinned layer and the second barrier layer, the second reference layer having a second magnetic direction that is opposite of the first magnetic direction.

23. The TMR sensor device of claim 21, wherein the first barrier layer and the second barrier layer each include MgO.

* * * * *